United States Patent
Mu et al.

(10) Patent No.: US 11,652,449 B2
(45) Date of Patent: May 16, 2023

(54) RADIO FREQUENCY TRANSISTOR AMPLIFIERS HAVING ENGINEERED INTRINSIC CAPACITANCES FOR IMPROVED PERFORMANCE

(71) Applicant: Wolfspeed, Inc., Durham, NC (US)

(72) Inventors: Qianli Mu, San Jose, CA (US); Zulhazmi Mokhti, Morgan Hill, CA (US); Jia Guo, Durham, NC (US); Scott Sheppard, Chapel Hill, NC (US)

(73) Assignee: Wolfspeed, Inc., Hickory, NC (US)

( * ) Notice: Subject to any disclaimer, the term of this patent is extended or adjusted under 35 U.S.C. 154(b) by 0 days.

(21) Appl. No.: 17/546,273

(22) Filed: Dec. 9, 2021

(65) Prior Publication Data
US 2022/0103130 A1 Mar. 31, 2022

Related U.S. Application Data

(62) Division of application No. 16/590,465, filed on Oct. 2, 2019, now Pat. No. 11,239,802.

(51) Int. Cl.
*H03F 1/30* (2006.01)
*H01L 29/20* (2006.01)
*H01L 29/778* (2006.01)
*H03F 3/193* (2006.01)

(52) U.S. Cl.
CPC ........... *H03F 1/30* (2013.01); *H01L 29/2003* (2013.01); *H01L 29/7787* (2013.01); *H03F 3/193* (2013.01)

(58) Field of Classification Search
CPC .... H03F 1/30; H01L 29/2003; H01L 29/7787
See application file for complete search history.

(56) References Cited

U.S. PATENT DOCUMENTS

| 7,012,285 | B2 | 3/2006 | Nakatsuka et al. |
| 9,679,981 | B2 | 6/2017 | Sriram et al. |
| 10,630,285 | B1 * | 4/2020 | Cuadra ............ H03K 17/04106 |
| 2002/0014633 | A1 | 2/2002 | Ashley et al. |
| 2006/0071250 | A1 | 4/2006 | Bude et al. |
| 2006/0255364 | A1 | 11/2006 | Saxler et al. |

(Continued)

FOREIGN PATENT DOCUMENTS

| CN | 104425487 B | 5/2017 |
| WO | 2014200753 A2 | 12/2014 |

OTHER PUBLICATIONS

"International Search Report and Written Opinion corresponding to International Patent Application No. PCT/US2020/050875, dated Mar. 10, 2021".

(Continued)

*Primary Examiner* — Patricia T Nguyen
(74) *Attorney, Agent, or Firm* — Myers Bigel, P.A.

(57) ABSTRACT

Gallium nitride based RF transistor amplifiers include a semiconductor structure having a gallium nitride based channel layer and a gallium nitride based barrier layer thereon, and are configured to operate at a specific direct current drain-to-source bias voltage. These amplifiers are configured to have a normalized drain-to-gate capacitance at the direct current drain-to-source bias voltage, and to have a second normalized drain-to-gate capacitance at two-thirds (Continued)

the direct current drain-to-source bias voltage, where the second normalized drain-to-gate capacitance is less than twice the first normalized drain-to-gate capacitance.

9 Claims, 6 Drawing Sheets

(56) References Cited

U.S. PATENT DOCUMENTS

| | | |
|---|---|---|
| 2010/0201439 A1 | 8/2010 | Wu et al. |
| 2011/0254612 A1 | 10/2011 | Kinoshita et al. |
| 2011/0309353 A1* | 12/2011 | Kaneko .................. H01L 29/45 |
| | | 257/E21.477 |
| 2013/0092958 A1* | 4/2013 | Chen .................. H01L 29/1608 |
| | | 257/77 |
| 2013/0175544 A1 | 7/2013 | Oishi et al. |
| 2015/0263156 A1 | 9/2015 | Morizuka |
| 2018/0025911 A1 | 1/2018 | Walke et al. |
| 2019/0109222 A1* | 4/2019 | Liu ......................... H03F 3/211 |
| 2020/0027872 A1* | 1/2020 | Boles ................ H01L 21/02381 |
| 2020/0303533 A1* | 9/2020 | Guo .................... H01L 29/0657 |
| 2020/0365701 A1 | 11/2020 | Ku et al. |

OTHER PUBLICATIONS

Chugh, Nisha, et al., "Impact of Donor Layer Thickness, Doping Concentration and Gate-Width on Gate-Capacitance of AlGaN/GaN Single and Double Heterostructure HEMT for Microwave Frequency Applications", 2018 IEEE Electron Device Kolkata Conference (EDKCON), Nov. 24-25, 2018, Kolkata, India, 207-212.

Mokhti, , et al., ""The Nonlinear Drain-Source Capacitance Effect on Continuous-Mode Class—B/J Power Amplifiers," IEEE Transactions on the Microwave Theory and Techniques, vol. 67, No. 7, Jul. 2019".

Nunes, , et al., ", "AM/AM and AM/PM Distortion Generational Mechanisms in SI LDMOS and GaN HETMT Based RF Power Amplifiers," IEEE Transactions on Microwave Theory and Techniques, vol. 62, No. 4, Apr. 2014".

Sajjadi Jaghargh, Sadaf S., et al., "An AlGaN/GaN HEMT by the periodic pits in the buffer layer", Physica Scripta, vol. 94, No. 10, Jul. 29, 2019.

* cited by examiner

RADIO FREQUENCY TRANSISTOR AMPLIFIERS HAVING ENGINEERED INTRINSIC CAPACITANCES FOR IMPROVED PERFORMANCE

CROSS-REFERENCE TO RELATED APPLICATIONS

This application is a division of, and claims priority under 35 U.S.C. § 120 to, U.S. patent application Ser. No. 16/590,465, filed Oct. 2, 2019, the entire disclosure of which is incorporated herein by reference.

FIELD

The inventive concepts described herein relate to microelectronic devices and, more particularly, to radio frequency ("RF") transistor amplifiers.

BACKGROUND

Electrical circuits requiring high power handling capability while operating at high frequencies, such as, for example radio frequencies in the 500 MHz-10 GHz frequency range, have become more prevalent in recent years. Because of the increase in high power, high frequency circuits, there has been a corresponding increase in demand for RF transistor amplifiers which are capable of reliably operating at these frequencies while still being capable of handling high power loads.

Silicon semiconductor materials are widely used in relatively low power, low frequency applications. Silicon, however, may not be well-suited for many high power and/or high frequency applications due to, for example, its relatively small bandgap (1.12 eV for Si at room temperature) and relatively small breakdown voltage.

Wide bandgap semiconductor materials such as silicon carbide ("SiC") and gallium nitride based materials such as, for example, gallium nitride ("GaN") and aluminum gallium nitride ("AlGaN"), are typically used to fabricate transistor amplifiers for high power, high frequency operation, as these semiconductor materials have much higher bandgaps (e.g., 2.996 eV for alpha SiC and 3.36 eV for GaN at room temperature). A device of particular interest for high power and/or high frequency applications is the gallium nitride based High Electron Mobility Transistor ("HEMT").

Gallium nitride based HEMT devices are formed in a semiconductor structure that includes a plurality of gallium nitride based semiconductor layers. The semiconductor structure may include a semiconductor substrate such as, for example, a GaN or SiC substrate. The gallium nitride based layers in the semiconductor structure may include a channel layer and a barrier layer. The barrier layer (e.g., an AlGaN layer) may have a higher bandgap energy than the channel layer (e.g., a GaN layer or an AlGaN layer with a lower aluminum concentration than the AlGaN barrier layer). A source contact, a drain contact and a gate contact are formed on the semiconductor structure so that the barrier layer is between the contacts and the channel layer. The source, drain and gate contacts may be formed of conductive materials such as, for example, semiconductor materials, metals and/or metal alloys.

A two-dimensional electron gas ("2DEG") may be formed at the heterojunction of the channel and barrier layers when appropriate voltages are applied to the source, drain and gate contacts. The channel layer may have a higher electron affinity than the wider bandgap barrier layer. The 2DEG is an accumulation layer in an upper surface of the channel layer and can contain a relatively high sheet electron concentration. Additionally, electrons that originate in the wider bandgap barrier layer may transfer to the 2DEG, allowing a relatively high electron mobility due to reduced ionized impurity scattering. This combination of relatively high carrier concentration and carrier mobility can give the HEMT a relatively large transconductance and may provide a performance advantage over metal-semiconductor field effect transistors ("MESFETS") for high-frequency applications.

Different types of gallium nitride based HEMT devices have been demonstrated. For example, U.S. Pat. Nos. 5,192,987, 5,296,395 and 6,316,793 describe example AlGaN/GaN HEMT devices.

SUMMARY

Pursuant to embodiments of the present invention, RF transistor amplifiers are provided that include a semiconductor structure that includes a gallium nitride based channel layer and a gallium nitride based barrier layer that has a higher bandgap than the gallium nitride based channel layer on the gallium nitride based channel layer, a source contact on the gallium nitride based barrier layer, a drain contact on the gallium nitride based barrier layer, and a gate contact on the gallium nitride based barrier layer between the source contact and the drain contact. These RF transistor amplifiers are configured to operate at a first direct current drain-to-source bias voltage, and are configured to have a first normalized drain-to-gate capacitance at the first direct current drain-to-source bias voltage, and to have a second normalized drain-to-gate capacitance at two-thirds the first direct current drain-to-source bias voltage. The second normalized drain-to-gate capacitance is less than twice the first normalized drain-to-gate capacitance.

In some embodiments, a normalized drain-to-gate capacitance response of the RF transistor amplifier may vary by less than a factor of four for all values of the drain-to-source voltage that are between one half the first direct current drain-to-source bias voltage and twice the first direct current drain-to-source bias voltage.

In some embodiments, a normalized drain-to-gate capacitance response of the RF transistor amplifier may vary by less than a factor of three for all values of the drain-to-source voltage that are between one half the first direct current drain-to-source bias voltage and twice the first direct current drain-to-source bias voltage.

In some embodiments, the RF transistor amplifier may be configured to have a normalized drain-to-source capacitance response that maintains at least 80% symmetry for a range of drain-to-source voltage values about the first direct current drain-to-source bias voltage that is equal to 50% of the first direct current drain-to-source bias voltage.

In some embodiments, the RF transistor amplifier may be configured to have a normalized drain-to-source capacitance response that maintains at least 90% symmetry for a range of drain-to-source voltage values about the first direct current drain-to-source bias voltage that is equal to 50% of the first direct current drain-to-source bias voltage.

In some embodiments, the RF transistor amplifier may be configured to have a normalized drain-to-source capacitance response that maintains at least 70% symmetry for a range of drain-to-source voltage values about the first direct current drain-to-source bias voltage that is equal to 100% of the first direct current drain-to-source bias voltage.

In some embodiments, the RF transistor amplifier may be configured to have a normalized drain-to-source capacitance response that maintains at least 80% symmetry for a range of drain-to-source voltage values about the first direct current drain-to-source bias voltage that is equal to 100% of the first direct current drain-to-source bias voltage.

In some embodiments, the RF transistor amplifier may be configured so that the normalized drain-to-gate capacitance response varies by less than 100% for drain-to-source voltages in a range from the first direct current drain-to-source bias voltage to 20 volts below the first direct current drain-to-source bias voltage.

In some embodiments, the first direct current drain-to-source bias voltage may be between 48 volts and 55 volts, and values of the normalized drain-to-gate capacitance may be less than $5 \times 10^{-15}$ farads per watt for all drain-to-source voltage values greater than 30 volts.

Pursuant to further embodiments of the present invention, RF transistor amplifiers are provided that include a semiconductor structure that includes a gallium nitride based channel layer and a gallium nitride based barrier layer that has a higher bandgap than the gallium nitride based channel layer on the gallium nitride based channel layer, a source contact on the gallium nitride based channel layer, a drain contact on the gallium nitride based barrier layer, and a gate contact on the gallium nitride based barrier layer between the source contact and the drain contact. These RF transistor amplifiers are configured to operate at a first direct current drain-to-source bias voltage and to have a normalized drain-to-source capacitance that maintains at least 85% symmetry for a range of drain-to-source voltages about the first direct current drain-to-source bias voltage that is equal to 50% of the first direct current drain-to-source bias voltage. A normalized drain-to-gate capacitance response of the RF transistor amplifier varies by less than a factor of four for all values of the drain-to-source voltage that are between one half the first direct current drain-to-source bias voltage and twice the first direct current drain-to-source bias voltage.

In some embodiments, a normalized drain-to-gate capacitance response of the RF transistor amplifier may vary by less than a factor of three for all values of the drain-to-source voltage that are between one half the first direct current drain-to-source bias voltage and twice the first direct current drain-to-source bias voltage.

In some embodiments, a normalized drain-to-gate capacitance response of the RF transistor amplifier may vary by less than a factor of two for all values of the drain-to-source voltage that are between two-thirds the first direct current drain-to-source bias voltage and twice the first direct current drain-to-source bias voltage.

In some embodiments, the RF transistor amplifier may be configured to have a first normalized drain-to-gate capacitance at the first direct current drain-to-source bias voltage, and to have a second normalized drain-to-gate capacitance at two-thirds the first direct current drain-to-source bias voltage, and the second normalized drain-to-gate capacitance may be less than twice the first normalized drain-to-gate capacitance.

In some embodiments, the RF transistor amplifier may be configured to have a normalized drain-to-source capacitance response that maintains at least 90% symmetry for a range of drain-to-source voltage values about the first direct current drain-to-source bias voltage that is equal to 50% of the first direct current drain-to-source bias voltage.

In some embodiments, the RF transistor amplifier may be configured so that a normalized drain-to-gate capacitance response varies by less than 100% for drain-to-source voltages in a range from the first direct current drain-to-source bias voltage to 20 volts below the first direct current drain-to-source bias voltage.

In some embodiments, values of the normalized drain-to-gate capacitance may be less than $4 \times 10^{-15}$ farads per watt for all drain-to-source voltage values greater than 32 volts.

In some embodiments, values of the normalized drain-to-gate capacitance may be less than $5 \times 10^{-15}$ farads per watt for all drain-to-source voltage values greater than 24 volts.

DETAILED DESCRIPTION

Figure 1:
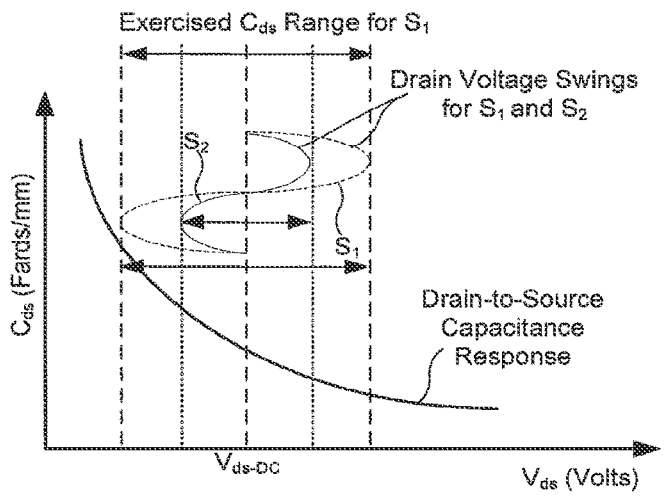
FIG. 1 is a graph illustrating the drain-to-source capacitance response of a conventional gallium nitride based RF transistor amplifier and how the drain-to-source capacitance varies based on the swing in the drain-to-source voltage of the input RF signals.

Pursuant to some embodiments of the present invention, RF transistor amplifiers are provided that each include a semiconductor structure having a gallium nitride based channel layer and a gallium nitride based barrier layer that has a higher bandgap than the gallium nitride based channel layer on the gallium nitride based channel layer. Source and drain contacts are provided on the gallium nitride based barrier layer, and a gate contact is provided on the gallium nitride based barrier layer between the source and drain contacts. The RF transistor amplifiers may be operated at a direct current drain-to-source bias voltage such as, for example, 48 volts. The RF transistor amplifiers are configured to have a first normalized drain-to-gate capacitance at the direct current drain-to-source bias voltage (e.g., at 48 volts), and to have a second normalized drain-to-gate capacitance at two-thirds the direct current drain-to-source bias voltage (e.g., at 32 volts). Herein, the normalized drain-to-gate capacitance of an RF transistor amplifier at a particular drain-to-source bias voltage when the gate is off refers to the off-state drain-to-gate capacitance of the RF transistor amplifier at the particular drain-to-gate bias voltage normalized based on the output power level of the RF transistor amplifier (i.e., in units of Farads per Watt). The second normalized drain-to-gate capacitance is less than twice the first normalized drain-to-gate capacitance. As a result, the RF transistor amplifier has a relatively linear normalized drain-to gate capacitance response for much or all of the drain voltage swing of the RF transistor amplifier, which may result in improved amplifier performance.

In some embodiments, the normalized drain-to-gate capacitance response of these RF transistor amplifiers may vary by less than a factor of four for all values of the drain-to-source voltage that are between one half the direct current drain-to-source bias voltage (e.g., 24 volts for a direct current drain-to-source bias voltage of 48 volts) and twice the direct current drain-to-source bias voltage (e.g., 96 volts for a direct current drain-to-source bias voltage of 48 volts). Additionally, the RF transistor amplifiers may be configured to have a normalized drain-to-source capacitance response that maintains at least 80% symmetry, and more preferably at least 85% symmetry, or at least 90% symmetry, for a range of drain-to-source voltage values about the direct current drain-to-source bias voltage that is equal to half (50%) the direct current drain-to-source bias voltage (i.e., the normalized drain-to-gate capacitance response maintains at least 80% symmetry over a range of drain-to-source voltage values from 36-60 volts when the direct current drain-to-source bias voltage is 48 volts). As explained further below, herein the normalized drain-to-source capacitance of an RF transistor amplifier at a particular drain-to-source bias voltage refers to the drain-to-source capacitance of the RF transistor amplifier at the particular drain-to-source bias voltage normalized based on the output power level of the RF transistor amplifier.

Pursuant to further embodiments of the present invention, gallium nitride based RF transistor amplifiers are provided that are operated at a direct current drain-to-source bias voltage level such as, for example, 48 volts. The RF transistor amplifiers are configured to have a normalized drain-to-source capacitance that maintains at least 85% symmetry for a range of drain-to-source voltages about the direct current drain-to-source bias voltage that is equal to one half the direct current drain-to-source bias voltage, and to have a normalized drain-to-gate capacitance response that varies by less than a factor four for all drain-to-source voltages that are between one half the direct current drain-to-source bias voltage and twice the direct current drain-to-source bias voltage.

Embodiments of the present invention will be described in greater detail below with reference to the accompanying figures.

Various performance parameters of an RF transistor amplifier such as its output power, gain, efficiency and linearity in terms of AM/AM and AM/PM distortion may be directly related to various intrinsic characteristics of the device including, for example, the saturation drain current ($I_{dsat}$), the transconductance ($g_m$), the drain-to-source resistance during operation ($R_{ds\text{-}on}$), and various parasitic intrinsic capacitances within the device including the drain-to-source capacitance ("$C_{ds}$"), the drain-to-gate capacitance ("$C_{dg}$") and the gate-to-source capacitance ("$C_{gs}$"). The present invention is directed to gallium nitride based RF HEMT transistor amplifiers in which the parasitic intrinsic drain-to-source and drain-to-gate capacitances $C_{ds}$, $C_{dg}$, are engineered to achieve improved AM/AM and AM/PM distortion performance and/or efficiency under various operating conditions.

The drain-to-source capacitance $C_{ds}$ of an RF transistor amplifier will vary as a function of the drain-to-source voltage ("$V_{ds}$"). A typical drain-to-source capacitance response for a gallium nitride based RF transistor amplifier is illustrated in FIG. 1, and shows that the drain-to-source capacitance $C_{ds}$ generally increases with decreasing drain-to-source voltage Vas level. As is understood by those of skill in the art, in operation, a direct current drain-to-source bias voltage ("$V_{ds\text{-}DC}$") is applied to an RF transistor amplifier, and an RF signal that is to be amplified is applied to the gate of the RF transistor amplifier. As shown by the graph in FIG. 1, the magnitude of the variation or "swing" in the drain-to-source voltage Vas is a function of the power of the sinusoidal RF input signal applied to the gate of the RF transistor amplifier. The graph in FIG. 1 illustrates the drain-to-source voltage swing for two different magnitude RF input signals $S_1$ and $S_2$. As shown in FIG. 1, the greater the magnitude of the RF input signal, the greater the swing in the drain-to-source voltage Vas, and hence the larger the variation in the drain-to-source capacitance $C_{ds}$. The range of drain-to-source capacitances $C_{ds}$ that will occur during operation is the "exercised $C_{ds}$ range" shown in FIG. 1, which corresponds to the drain-to-source capacitance values for the full swing of the drain-to-source voltage about the direct current drain-to-source bias voltage $V_{ds\text{-}DC}$.

Non-linearities in the drain-to-source capacitance response of an RF transistor amplifier may contribute to AM/PM distortion in the output of the RF transistor amplifier. AM/PM distortion refers to amplitude dependent distortions in the phase of the output RF signal that occur due to non-linearities in the amplifier. AM/PM distortion may cause spectral regrowth (intermodulation products) that may interfere with adjacent channels (in terms of frequency) in a communication system. Thus, communication system operators may place strict requirements on the AM/PM distortion levels of components used in a communication system.

As shown in FIG. 1, the drain-to-source capacitance response of an RF transistor amplifier varies with the sinusoidal swing of the input RF signal. The present invention arises, in part, from a realization that if the drain-to-source capacitance response is substantially symmetrical about the direct current drain-to-source bias voltage $V_{ds\text{-}DC}$ for the full magnitude or "swing" of the drain-to-source voltage $V_{ds}$, then the drain-to-source capacitance $C_{ds}$ may effectively appear to be linear, as the larger values of the drain-to-source capacitance $C_{ds}$ that are exhibited at drain-to-source voltage values that are below the direct current drain-to-source bias voltage $V_{ds\text{-}DC}$ are cancelled out by the smaller values of the drain-to-source capacitance $C_{ds}$ that are exhibited at drain-to-source voltage values that are above the direct current drain-to-source bias voltage $V_{ds\text{-}DC}$. However, if the drain-to-source capacitance response is asymmetric about the direct current drain-to-source bias voltage $V_{ds\text{-}DC}$ for at least a portion of the drain-to-source voltage swing, then the smaller values of the drain-to-source capacitance $C_{ds}$ above the direct current drain-to-source bias voltage $V_{ds\text{-}DC}$ will no longer completely cancel out the larger drain-to-source capacitance $C_{ds}$ values below the direct current drain-to-source bias voltage $V_{ds\text{-}DC}$. In this situation, the drain-to-source capacitance response will appear to be non-linear, and the non-linear response will generate AM/PM distortion.

Figure 2A:
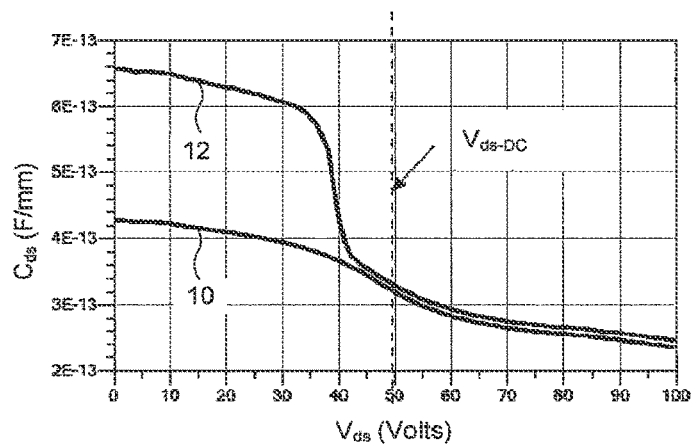
FIG. 2A is a graph illustrating the drain-to-source capacitance responses for two different RF transistor amplifier designs.
Figure 2B:
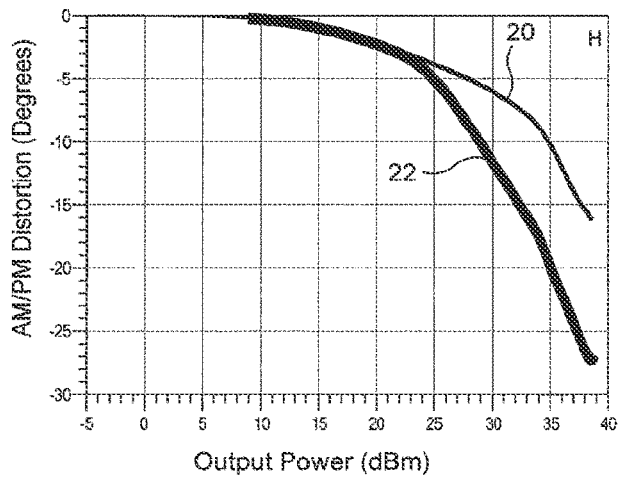
FIG. 2B is a graph that illustrates the AM/PM distortion performance of the two RF transistor amplifier designs having the drain-to-source capacitance responses shown in FIG. 2A.

FIGS. 2A and 2B illustrate how asymmetries in the drain-to-source capacitance response that are within the drain-to-source voltage swing may result in increased AM/PM distortion. In particular, FIG. 2A is a graph illustrating two different drain-to-source capacitance responses that correspond to first and second RF transistor amplifier designs, and FIG. 2B is a graph illustrating the simulated AM/PM distortion as a function of output power for the first and second RF transistor amplifier designs used to generate the curves in FIG. 2A. Both of the first and second RF transistor amplifier designs are biased with a 48 volt direct current drain-to-source bias voltage $V_{ds\text{-}DC}$.

Referring first to FIG. 2A, the drain-to-source capacitance response 10 that corresponds to the first RF transistor amplifier design has a high level of symmetry about the 48 volt direct current drain-to-source bias voltage $V_{ds\text{-}DC}$. In contrast, the drain-to-source capacitance response 12 that corresponds to the second RF transistor amplifier design is only symmetric for a relatively small range of drain-to-source voltage values (i.e., a range of about 10 volts) about the 48 volt direct current drain-to-source bias voltage $V_{ds\text{-}DC}$.

FIG. 2B illustrates the impact that the asymmetries in the drain-to-source capacitance response may have on AM/PM distortion. In particular, curves 20 and 22 in FIG. 2B show the AM/PM distortion levels as a function of output power for first and second RF transistor amplifiers having the drain-to-source capacitance responses 10, 12 of FIG. 2A, respectively. The curves 20, 22 in FIG. 2B include the AM/PM distortion resulting from a variety of different non-linearities in the RF transistor amplifiers, so it is a comparison between the two curves 20, 22 in FIG. 2B that shows the impact of the different drain-to-source capacitance responses on AM/PM distortion performance. As shown by curve 20 in FIG. 2B, which corresponds to the drain-to-source capacitance response curve 10 in FIG. 2A, the AM/PM distortion is almost non-existent at output power levels up to about 10 dBm, and then starts to gradually increase with a gently increasing slope up until an output power of about 33 dBm, and after that AM/PM distortion performance degrades very quickly. As shown by curve 22 in FIG. 2B, which corresponds to the drain-to-source capacitance response curve 12 in FIG. 2A, the AM/PM distortion level tracks curve 20 very closely up to output power levels of about 23 dBm, but then the AM/PM distortion performance starts to degrade very quickly. Thus, FIG. 2B shows that the first RF transistor amplifier having the symmetric drain-to-source capacitance response 10 can operate at output power levels that are 6-7 dBm higher than the second RF transistor amplifier having the asymmetric drain-to-source capacitance response 12 while generating approximately the same amount of AM/PM distortion.

Figure 3A:
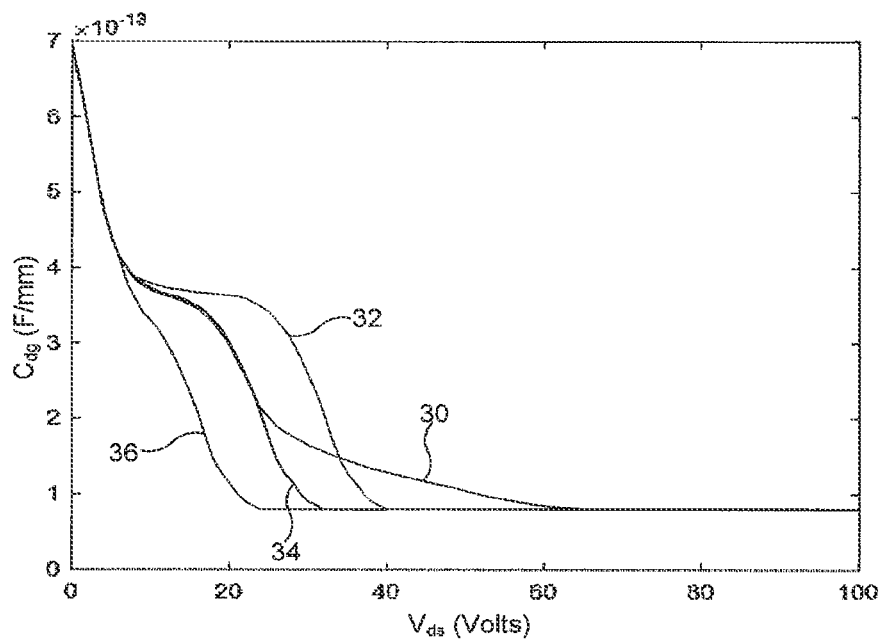
FIG. 3A is a graph illustrating the drain-to-gate capacitance responses for four different RF transistor amplifier designs.
Figure 3B:
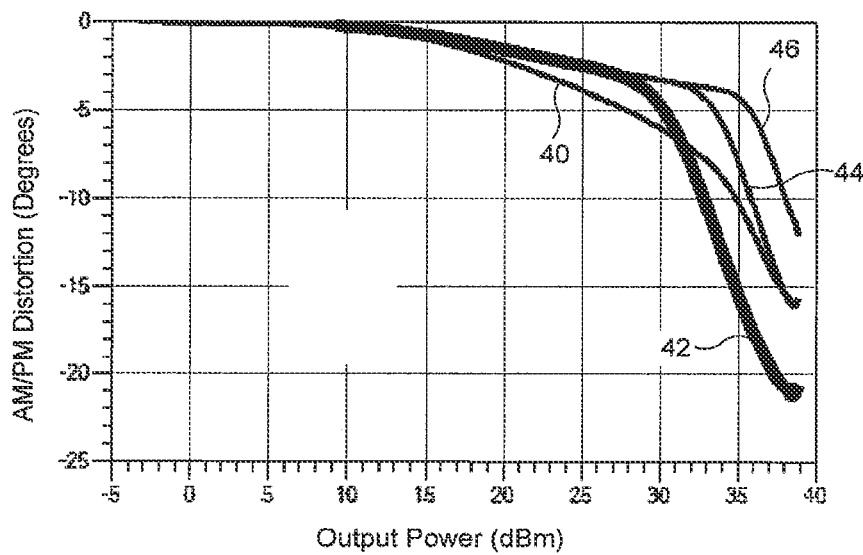
FIG. 3B is a graph that illustrates the AM/PM distortion performance of the four RF transistor amplifier designs having the drain-to-gate capacitance responses shown in FIG. 3A.

As with non-linearities in the intrinsic drain-to-source capacitance response, non-linearities in the intrinsic drain-to-gate capacitance response may also lead to AM/PM distortion in the output signal of an RF transistor amplifier. FIGS. 3A and 3B illustrate how the drain-to-gate capacitance response of an RF transistor amplifier impacts AM/PM distortion performance. In particular, FIG. 3A is a graph illustrating the drain-to-gate capacitance responses for four different RF transistor amplifier designs, and FIG. 3B is a graph illustrating the simulated AM/PM distortion as a function of output power for the four RF transistor amplifier designs used to generate the curves in FIG. 3A. All four of the RF transistor amplifiers are biased with a 48 volt direct current drain-to-source bias voltage $V_{ds\text{-}DC}$.

As shown in FIG. 3A, for all four RF transistor amplifiers, the drain-to-gate capacitance $C_{dg}$ is constant at high drain-to-source voltage values, and then increases steadily once the drain-to-source voltage $V_{ds}$ is reduced below a certain "knee" voltage at which the capacitance starts to increase at a much faster rate. In conventional RF transistor amplifiers, the "knee" in the drain-to-gate capacitance response typically occurs at a drain-to-source voltage Vas that exceeds the direct current drain-to-source bias voltage $V_{ds\text{-}DC}$, as shown by curve 30 in FIG. 3A (i.e., the knee voltage occurs at Vas 62 volts, which is significantly above the 48 volt direct current drain-to-source bias voltage $V_{ds\text{-}DC}$). In the remaining three drain-to-gate capacitance responses 32, 34, 36 shown in FIG. 3A, the knee voltage is shifted to the left (i.e., to lower drain-to-source voltage Vas levels). In curve 32, the drain-to-gate capacitance $C_{dg}$ starts to quickly increase at $V_{ds} \approx 40$ volts, in curve 34, the drain-to-gate capacitance $C_{dg}$ starts to quickly increase at $V_{ds} \approx 31$ volts, and in curve 36, the drain-to-gate capacitance $C_{dg}$ starts to quickly increase at $V_{ds} \approx 23$ volts.

FIG. 3B illustrates the impact that the different drain-to-gate capacitance responses 30, 32, 34, 36 of FIG. 3A have on AM/PM distortion performance. The curves in FIG. 3B include the AM/PM distortion resulting from a variety of different non-linearities in the RF transistor amplifiers, so it is a comparison between the curves in FIG. 3B that shows the impact of the different drain-to-gate capacitance responses on AM/PM distortion performance. Curve 40 in FIG. 3B, which corresponds to the drain-to-gate capacitance response curve 30 in FIG. 3A, illustrates the AM/PM distortion for a conventional RF transistor amplifier. As shown in FIG. 3B, the AM/PM distortion is almost non-existent at output power levels up to about 10 dBm, and then starts to increase at a moderate level up to an output power of about 33 dBm, at which point the AM/PM performance degrades very quickly.

Curves 42, 44, and 46 illustrate the AM/PM distortion performance for the RF transistor amplifiers having the drain-to-gate capacitance responses 32, 34, 36 in FIG. 3A, respectively. As shown in FIG. 3B, the AM/PM distortion curves 42, 44, 46 have almost identical shapes, differing only in the output power level where the AM/PM distortion starts to rapidly degrade. For curve 42, AM/PM distortion performance starts to rapidly degrade at an output power level of about 28 dBm, for curve 44, AM/PM distortion performance starts to rapidly degrade at an output power level of about 32 dBm, and for curve 46, AM/PM distortion performance starts to rapidly degrade at an output power level of about 35 dBm.

Two general trends can be seen from FIGS. 3A and 3B. First, the farther to the left the knee in the response is in FIG. 3A (i.e., the lower the drain-to-source voltage Vas at which the drain-to-gate capacitance $C_{dg}$ starts to increase much more quickly from a baseline level), the better the AM/PM distortion performance of the RF transistor amplifier. Second, the slope of the increase in drain-to-gate capacitance $C_{dg}$ also matters. This can be seen by the fact that curve 42 crosses curve 40 in FIG. 3B. This occurs because the slope of curve 30 is less than the slope of curve 32 in FIG. 3A, resulting in curve 32 crossing curve 30 at a drain-to-source voltage of about 25 volts.

The drain-to-gate capacitance response also impacts the AM/AM distortion performance of the RF transistor amplifier. The AM/AM characteristic for an RF transistor amplifier refers to the amplitude-dependent gain variation of the RF transistor amplifier. As the drain-to-gate capacitance level increases, the RF transistor amplifier will start to experience gain compression, and the greater the slope of the increase in the drain-to-gate capacitance response, the more gain compression that will occur. Gain compression refers to a decrease in the gain of an amplifier (where gain is a measure of the degree to which the level of an input signal is increased by the amplifier) that can occur as the output power level of the amplifier is increased. Typically, the gain of an RF transistor amplifier will be relatively constant for lower output power levels, and the gain will then start to decrease with increasing intensity as the output power level is increased. For silicon based RF transistor amplifiers, the gain response transitions from a relatively linear range to the rapidly decreasing range somewhat abruptly. For gallium nitride based RF transistor amplifiers, the gain response transitions from the relatively linear range to the decreasing range more gradually (although the gain still drops off rapidly at higher output power levels), and the transition tends to occur at relatively lower output power levels. This more gradual reduction in gain is typically referred to as "soft" gain compression. Soft gain compression is generally undesirable as linearity requirements for a communication system typically require that the amplifiers be run at relatively small gain compression levels (e.g., within 1-3 dB of the peak gain). Since soft gain compression may occur at relatively low output power levels in gallium nitride based RF transistor amplifiers, the amplifier may be constrained to run at a relatively low output power level in order to stay within a specified level of gain compression. In many cases, the maximum output power level that will achieve the requisite degree of linearity may be well below the output power level where the amplifier reaches its peak efficiency. Thus, in order to maintain a desired degree of linearity, it may be necessary to operate the amplifier at lower output power levels and at reduced efficiency, resulting in higher operating costs.

Figure 4A:
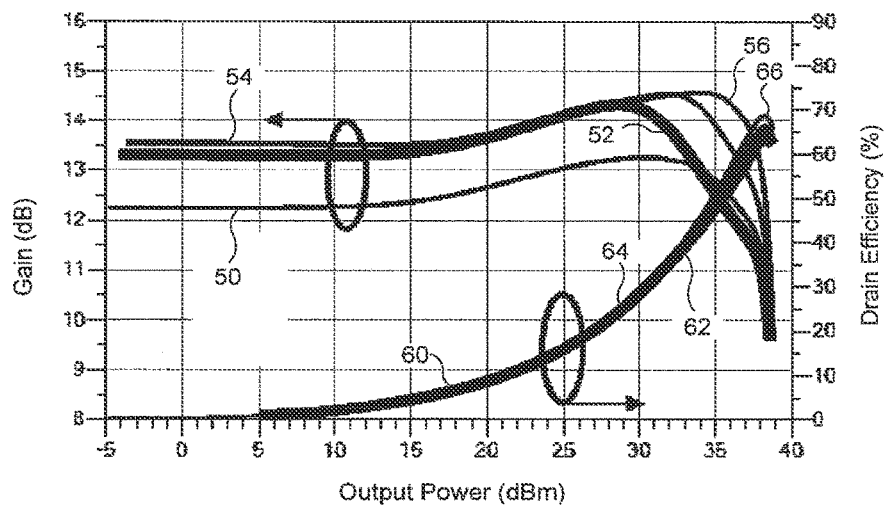
FIG. 4A is a graph illustrating the gain and drain efficiency performance as a function of output power for the four RF transistor amplifier designs used to generate the curves in FIGS. 3A and 3B.
Figure 4B:
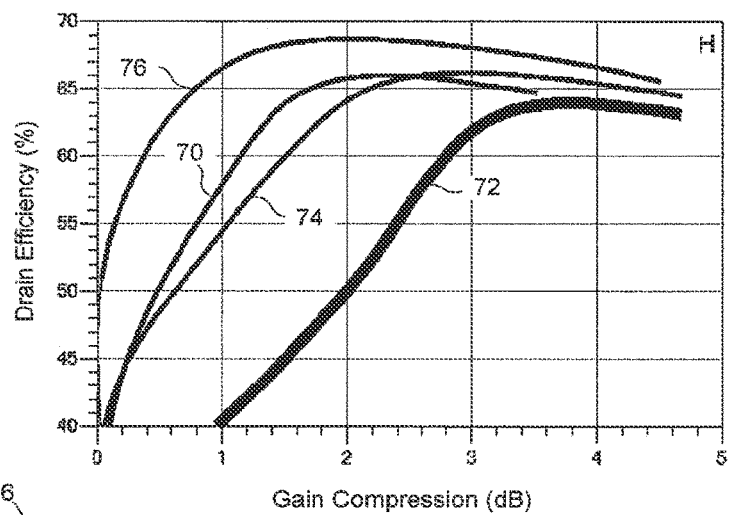
FIG. 4B is a graph of the drain efficiency as a function of gain compression for the four RF transistor amplifier designs used to generate the curves in FIGS. 3A and 3B.

The impact of soft gain compression on efficiency can be seen in FIGS. 4A and 4B. In particular, FIG. 4A is a graph illustrating the gain in dB (the left-side vertical axis) and the drain efficiency (the right-side vertical axis) as a function of output power for the four RF transistor amplifier designs used to generate the curves in FIGS. 3A and 3B. FIG. 4B is a graph of the drain efficiency as a function of gain compression for the same four RF transistor amplifier designs.

Referring to FIG. 4A, curves 50, 52, 54, 56 correspond to the RF transistor amplifiers having the drain-to-gate capacitance responses of curves 30, 32, 34, 36 in FIG. 3A, respectively. As can be seen, the farther to the left in FIG. 3A where the "knee" occurs in the drain-to-gate capacitance response, the higher the maximum gain of the corresponding RF transistor amplifier and the larger the output power level where the maximum gain occurs. Thus, FIG. 4A shows that pushing the knee of the drain-to-gate capacitance response to the left results in improved gain performance. Curves 60, 62, 64, 66 in FIG. 4A show that the farther to the left in FIG. 3A where the "knee" occurs in the drain-to-gate capacitance response, the higher the drain efficiency of the RF transistor amplifier. FIG. 4B illustrates this effect more clearly. In FIG. 4B, curves 70, 72, 74, 76 correspond to the RF transistor amplifiers having the drain-to-gate capacitance responses of curves 30, 32, 34, 36 in FIG. 3A, respectively. FIG. 4B shows that the RF transistor amplifier designs having the highest efficiency also achieve that efficiency at the lowest levels of gain compression, meaning that not only are these amplifiers more efficient, they also are more linear. Thus, by improving the drain-to-gate capacitance response on an RF transistor amplifier it may be possible to improve the AM/PM distortion performance, the linearity performance, the gain and/or the efficiency of an RF transistor amplifier.

Figure 4C:
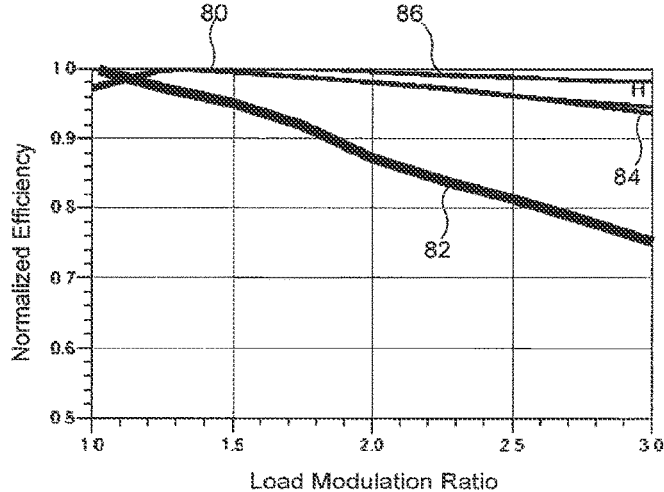
FIG. 4C is a graph illustrating the drain efficiency at 3 dB gain compression as a function of the load modulation ratio for the four RF transistor amplifier designs used to generate the data shown in FIGS. 3A-3B.

The shape of the drain-to-gate capacitance response also affects the efficiency performance of an RF transistor amplifier during load modulation. Such load modulation occurs in Doherty amplifiers. FIG. 4C illustrates the drain efficiency at 3 dB gain compression as a function of load modulation ratio for the four RF transistor amplifier designs used to generate the data shown in FIGS. 3A-3B and 4A-4B. In FIG. 4C, curves 80, 82, 84, 86 correspond to the RF transistor amplifiers having the drain-to-gate capacitance responses of curves 30, 32, 34, 36 in FIG. 3A, respectively. It can be seen that once again the RF transistor amplifier designs having drain-to-gate capacitance responses in which the knee of the curve is pushed to the left generally provide the best load modulation performance.

Referring again to FIG. 2A, curve 10 illustrates the drain-to-source capacitance response for a conventional gallium nitride based RF transistor amplifier design. As shown, this drain-to-source capacitance response is relatively symmetric. As discussed above with reference to FIG. 2B, such a symmetric drain-to-source capacitance response may result in the drain-to-source capacitance $C_{ds}$ having a reduced impact on AM/PM distortion. Unfortunately, however, the drain-to-gate capacitance response for a conventional gallium nitride based RF transistor amplifier having the drain-to-source capacitance response shown in curve 10 typically will be unsatisfactory, and may lead to significant AM/AM and AM/PM distortion. Various steps may be taken to try to improve the drain-to-gate capacitance response of the RF transistor amplifier such as, for example, adding a field plate to the device. However, these steps tend to degrade the shape of the drain-to-source capacitance response, resulting in a drain-to-source capacitance response such as shown by curve 12 in FIG. 2A.

Conventionally, the parasitic intrinsic drain-to-source and drain-to-gate capacitances $C_{ds}$, $C_{dg}$ have been treated separately in the design process. Techniques applied, for example, to improve the linearity of the drain-to-gate capacitance response typically also impact the drain-to-source capacitance response. Thus, even if an RF transistor amplifier design has a symmetric drain-to-source capacitance response, efforts to improve the drain-to-gate capacitance response may change the drain-to-source capacitance response, resulting, for example, in the drain-to-source capacitance response shown as curve 12 in FIG. 2A. This modified drain-to-source capacitance response may be symmetric for only a small portion of the drain-to-source voltage swing about the direct current bias voltage $V_{ds\text{-}DC}$, and hence may result in significant AM/PM distortion when larger input signals are applied to the RF transistor amplifier.

Attempting to optimize the parasitic intrinsic drain-to-source and drain-to-gate capacitance responses separately, as has been done conventionally, may lead to sub-optimum performance. Applicants have discovered that by considering the impact of design changes on both the drain-to-source and drain-to-gate capacitance responses, improved performance may be achieved for a target application of an RF transistor amplifier. In particular, the drain-to-source and drain-to-gate capacitance responses can both degrade key RF transistor amplifier performance parameters (e.g., AM/PM distortion, gain, efficiency, gain compression, etc.), and the design modifications that are used to change the drain-to-source and drain-to-gate capacitance responses typically involve at least some degree of tradeoff where improving one of the drain-to-source and drain-to-gate capacitance responses may negatively impact the other. Pursuant to embodiments of the present invention, both the drain-to-source capacitance response and the drain-to-gate capacitance response may be simultaneously taken into consideration in the design process to provide RF transistor amplifiers exhibiting improved overall performance.

A variety of different techniques may be used to change the drain-to-gate capacitance response of an RF transistor amplifier design. In one known approach, field plates are added to the RF transistor amplifier to not only manage field distribution between the gate and drain regions, but also to affect both the drain-to-source and drain-to-gate capacitances $C_{ds}$, $C_{dg}$. Using conventional field plate designs as an approach to engineer the $C_{ds}$, $C_{dg}$ responses to have optimum shapes and values tends to have limits in terms of how much shaping can be accomplished and the minimum values of $C_{ds}$, $C_{dg}$ that are achievable. In another approach, a more advanced field plate concept is introduced so that the HEMT transistor includes a double-gate or "Cascode" structure in which a second gate is provided that is separated from the barrier layer by a thin spacer layer and that is grounded through a connection to the source. Examples of gallium nitride based HEMT devices having such Cascode structures are disclosed, for example, in U.S. Pat. No. 9,679,981, the entire content of which is incorporated herein by reference. The addition of the double gate structure tends to improve the drain-to-gate capacitance response, but also may degrade the symmetry and/or the level of the drain-to-source capacitance response, which is seen as a tradeoff in achieving optimum shapes and values for the $C_{ds}$ and $C_{dg}$ responses simultaneously.

In another known approach, the charge density in the upper surface of the semiconductor structure in the region between the gate contact and the drain contact may be reduced. By engineering the amount of the charge reduction in this region as well as the depth of the region, the lateral size of the region and how closely the reduced charge region extends toward the gate contact, it is possible to engineer the drain-to-source and drain-to-gate capacitance responses. With this approach, it may be possible to improve both the drain-to-source and drain-to-gate capacitance responses at the same time, at least to a degree. Examples of gallium nitride based HEMT devices having such engineered charge densities in the region between the gate and the drain are disclosed, for example, in U.S. patent application Ser. No. 16/356,234, filed Mar. 18, 2019, the entire content of which is incorporated herein by reference.

It has been discovered that the performance of an RF transistor amplifier may generally be improved by maintaining the symmetry of the drain-to-source capacitance response while pushing the knee in the curve of the drain-to-gate capacitance response as far to the left as possible. Thus, in optimizing the design of an RF transistor amplifier, both responses should be taken into account simultaneously.

Figure 5A:
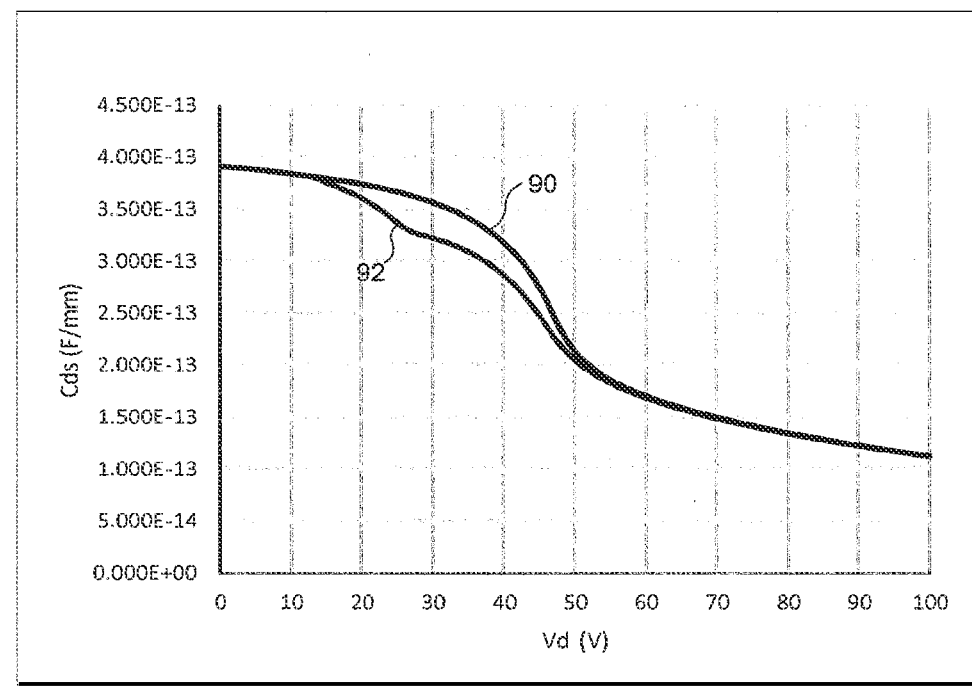
FIG. 5A is a graph of the simulated drain-to-source capacitance responses for a conventional RF transistor amplifier design and for an RF transistor amplifier design according to embodiments of the present invention.
Figure 5B:
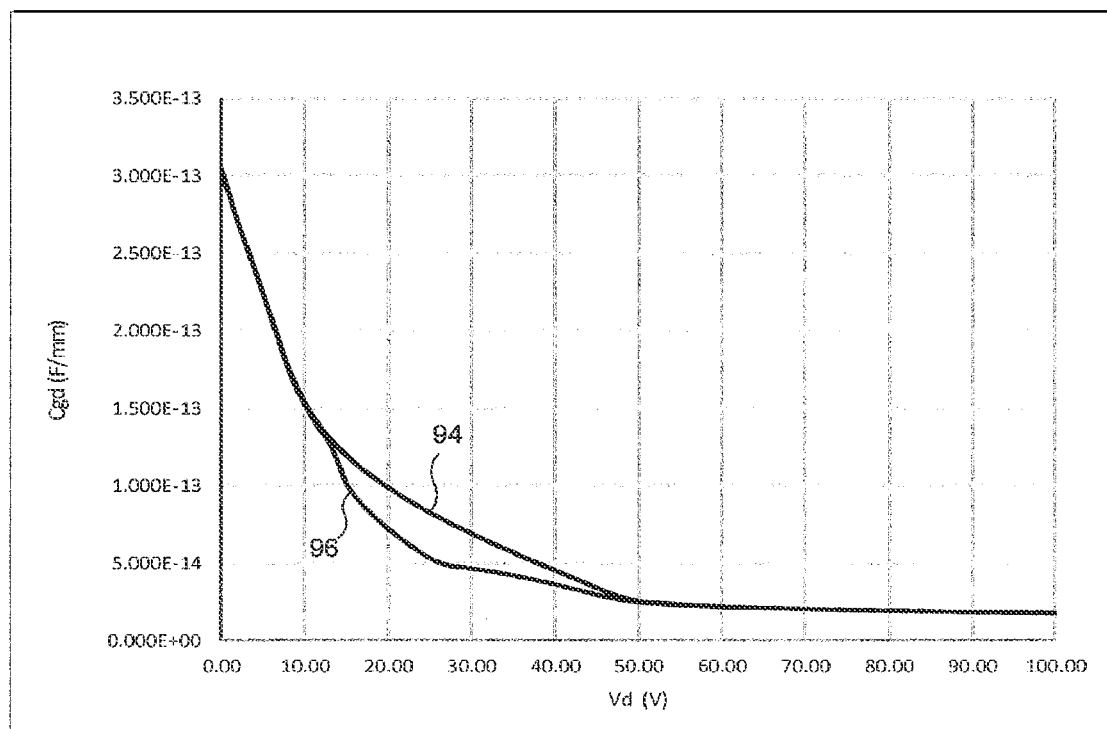
FIG. 5B is a graph of the simulated drain-to-gate capacitance responses for the RF transistor amplifier designs used to generate the drain-to-source capacitance responses of FIG. 5A.

FIGS. 5A and 5B illustrate the improved drain-to-source and drain-to-gate capacitance responses that can be achieved according to embodiments of the present invention. In particular, FIG. 5A is a graph of the simulated drain-to-source capacitance responses for a conventional RF transistor amplifier design (curve 90) and for an RF transistor amplifier design according to embodiments of the present invention (curve 92). FIG. 5B is a graph of the simulated drain-to-gate capacitance responses for the conventional RF transistor amplifier design (curve 94) and for the RF transistor amplifier design according to embodiments of the present invention (curve 96) that were used to generate the drain-to-source capacitance responses of FIG. 5A.

As shown in FIG. 5A, both the conventional RF transistor amplifier design and the RF transistor amplifier design according to embodiments of the present invention have a generally symmetric drain-to-source capacitance response about the 48 volt direct current drain-to-source bias voltage $V_{ds-DC}$, maintaining better than 85% symmetry across the full range of data simulated (see the discussion of symmetry below). However, as shown in FIG. 5B, the RF transistor amplifier design according to embodiments of the present invention exhibits a significantly improved drain-to-gate capacitance response as compared to the conventional RF transistor amplifier design. As can be seen in FIG. 5B, the "knee" of the drain-to-gate capacitance response for the conventional RF transistor amplifier design occurs at about the 48 volt direct current drain-to-source bias voltage $V_{ds-DC}$. In contrast, the "knee" of the drain-to-gate capacitance response (curve 96) for the RF transistor amplifier design according to embodiments of the present invention occurs at about 25 volts. Consequently, the drain-to-gate capacitance $C_{dg}$ for the conventional RF transistor amplifier is higher than the drain-to-gate capacitance $C_{dg}$ for the RF transistor amplifier according to embodiments of the present invention at all values of the drain-to-source voltage between about 14 volts and about 48 volts, with the two curves converging at drain-to-source voltage values below about 14 volts and above about 48 volts. Thus, FIGS. 5A and 5B show that the RF transistor amplifiers according to embodiments of the present invention may provide significantly improved overall performance.

Pursuant to some embodiments of the present invention, RF transistor amplifiers are provided that each include a semiconductor structure having a gallium nitride based channel layer and a gallium nitride based barrier layer that has a higher bandgap than the gallium nitride based channel layer on the gallium nitride based channel layer. Source and drain contacts are provided on the gallium nitride based barrier layer, and a gate contact is provided on the gallium nitride based barrier layer between the source and drain contacts. These RF transistor amplifiers are configured to have a drain-to-source capacitance response that maintains at least 90% symmetry for a range of drain-to-source voltage values of 40 volts about the direct current drain-to-source bias voltage $V_{ds-DC}$ (i.e., for $V_{ds-DC}$ values of 28-60 volts when $V_{ds-DC}$ is 48 volts).

The degree of symmetry of the drain-to-source capacitance response for an RF transistor amplifier generally tends to degrade with increasing distance from the direct current drain-to-source bias voltage $V_{ds-DC}$. Accordingly, for purposes of this disclosure, the "symmetry" of a drain-to-source capacitance response over a range of 2*X volts about the direct current drain-to-source bias voltage $V_{ds-DC}$ may be specified by averaging the value of the drain-to-source capacitance $C_{ds1}$ at $V_{ds-DC}+X$ and the value of the drain-to-source capacitance $C_{ds2}$ at $V_{ds-DC}-X$ and comparing that average to the direct current drain-to-source bias voltage $V_{ds-DC}$. In particular, the degree of symmetry of a drain-to-source capacitance response over a range of 2*X volts about the direct current drain-to-source bias voltage $V_{ds\text{-}DC}$ may be calculated as follows for the purposes of this disclosure:

Symmetry (%)=MIN[$2*C_{ds\text{-}DC}/(C_{ds1}+C_{ds2})$ and $(C_{ds1}+C_{ds2})/(2*C_{ds\text{-}DC})$]

where MIN[ ] represents a minimum function that selects the minimum of the values within the brackets, $C_{ds\text{-}DC}$ is the value of the drain-to-source capacitance $C_{ds}$ at a drain-to-source voltage Vas equal to $V_{ds\text{-}DC}$, $C_{ds1}$ is the value of the drain-to-source capacitance $C_{ds}$ at a drain-to-source voltage Vas equal to $V_{ds\text{-}DC}$+X volts, and Case is the value of the drain-to-source capacitance $C_{ds}$ at a drain-to-source voltage Vas equal to $V_{ds\text{-}DC}$ −X volts.

TABLE 1 below provides the data points corresponding to the simulated drain-to-source capacitance and drain-to-gate capacitance responses shown in FIGS. 5A and 5B when the RF transistor amplifier is operated at a direct current drain-to-source bias voltage $V_{ds\text{-}DC}$ of 48 volts. In TABLE 1, the values of Vas are in volts, the values of $C_{ds}$ are in picofarads/millimeter (pF/mm) and the values of $C_{dg}$ are in femtofarads/millimeter (fF/mm).

TABLE 1

| $V_{ds}$ | $C_{ds}$ | $C_{dg}$ |
|---|---|---|
| 1 | 0.389 | 285.7 |
| 2 | 0.389 | 269.4 |
| 3 | 0.389 | 254.0 |
| 4 | 0.388 | 238.9 |
| 5 | 0.388 | 223.4 |
| 6 | 0.387 | 207.5 |
| 7 | 0.386 | 190.4 |
| 8 | 0.385 | 175.3 |
| 9 | 0.384 | 162.1 |
| 10 | 0.384 | 151.6 |
| 11 | 0.383 | 142.6 |
| 12 | 0.382 | 134.3 |
| 13 | 0.381 | 126.7 |
| 14 | 0.379 | 114.8 |
| 15 | 0.375 | 100.8 |
| 16 | 0.373 | 93.25 |
| 17 | 0.370 | 87.09 |
| 18 | 0.367 | 81.70 |
| 19 | 0.364 | 76.79 |
| 20 | 0.361 | 72.24 |
| 21 | 0.357 | 67.97 |
| 22 | 0.352 | 63.89 |
| 23 | 0.348 | 60.08 |
| 24 | 0.343 | 56.43 |
| 25 | 0.337 | 53.23 |
| 26 | 0.332 | 50.61 |
| 27 | 0.328 | 48.90 |
| 28 | 0.326 | 47.87 |
| 29 | 0.324 | 47.29 |
| 30 | 0.322 | 46.53 |
| 31 | 0.320 | 45.73 |
| 32 | 0.318 | 44.92 |
| 33 | 0.315 | 44.04 |
| 34 | 0.312 | 43.12 |
| 35 | 0.309 | 42.12 |
| 36 | 0.305 | 41.04 |
| 37 | 0.301 | 39.94 |
| 38 | 0.297 | 38.78 |
| 39 | 0.292 | 37.56 |
| 40 | 0.286 | 36.31 |
| 41 | 0.280 | 35.02 |
| 42 | 0.273 | 33.69 |
| 43 | 0.265 | 32.33 |
| 44 | 0.256 | 30.96 |
| 45 | 0.247 | 29.60 |
| 46 | 0.237 | 28.33 |
| 47 | 0.228 | 27.20 |
| 48 | 0.219 | 26.26 |
| 49 | 0.211 | 25.50 |
| 50 | 0.205 | 24.88 |
| 51 | 0.199 | 24.37 |

TABLE 1-continued

| $V_{ds}$ | $C_{ds}$ | $C_{dg}$ |
|---|---|---|
| 52 | 0.194 | 23.94 |
| 53 | 0.190 | 23.58 |
| 54 | 0.186 | 23.26 |
| 55 | 0.182 | 22.97 |
| 56 | 0.179 | 22.71 |
| 57 | 0.176 | 22.48 |
| 58 | 0.173 | 22.26 |
| 59 | 0.171 | 22.05 |
| 60 | 0.168 | 21.86 |
| 61 | 0.166 | 21.68 |
| 62 | 0.163 | 21.51 |
| 63 | 0.161 | 21.35 |
| 64 | 0.159 | 21.20 |
| 65 | 0.157 | 21.05 |
| 66 | 0.155 | 20.91 |
| 67 | 0.153 | 20.77 |
| 68 | 0.152 | 20.64 |
| 69 | 0.150 | 20.52 |
| 70 | 0.148 | 20.39 |
| 71 | 0.147 | 20.28 |
| 72 | 0.145 | 20.16 |
| 73 | 0.144 | 20.05 |
| 74 | 0.142 | 19.94 |
| 75 | 0.141 | 19.84 |
| 76 | 0.139 | 19.73 |
| 77 | 0.138 | 19.63 |
| 78 | 0.136 | 19.53 |
| 79 | 0.135 | 19.43 |
| 80 | 0.134 | 19.34 |
| 81 | 0.132 | 19.24 |
| 82 | 0.131 | 19.15 |
| 83 | 0.130 | 19.06 |
| 84 | 0.129 | 18.97 |
| 85 | 0.128 | 18.89 |
| 86 | 0.126 | 18.80 |
| 87 | 0.125 | 18.72 |
| 88 | 0.124 | 18.63 |
| 89 | 0.123 | 18.47 |
| 90 | 0.122 | 18.55 |
| 91 | 0.121 | 18.39 |
| 92 | 0.120 | 18.31 |
| 93 | 0.119 | 18.23 |
| 94 | 0.118 | 18.15 |
| 95 | 0.117 | 18.07 |
| 96 | 0.116 | 18.00 |
| 97 | 0.115 | 17.92 |
| 98 | 0.114 | 17.84 |
| 99 | 0.113 | 17.77 |
| 100 | 0.112 | 17.70 |

As an example, the degree of symmetry of the drain-to-source capacitance response listed in TABLE 1 over a range of 8 volts (X=4) about the direct current drain-to-source bias voltage $V_{ds\text{-}DC}$ is calculated as:

Symmetry=MIN[$(2*0.219)/(0.256+0.194)$ and $(0.256+0.194)/(2*0.219)$]=97.3%

Performing the same calculation for values of X=12 and X=24, it can be seen that the drain-to-source capacitance response is 92.6% symmetric for a voltage swing of 24 volts about the 48 volt direct current drain-to-source bias voltage $V_{ds\text{-}DC}$ and is 89.8% symmetric for a voltage swing of 48 volts about the 48 volt direct current drain-to-source bias voltage $V_{ds\text{-}DC}$. Thus, pursuant to some embodiments of the present invention, RF transistor amplifiers are provided that maintain at least 90% symmetry about the direct current drain-to-source bias voltage $V_{ds\text{-}DC}$ for a range of drain-to-source voltage values equal to 50% the direct current drain-to-source bias voltage $V_{ds\text{-}DC}$, and that maintain at least 85% symmetry about the direct current drain-to-source bias voltage $V_{ds\text{-}DC}$ for a range of drain-to-source voltage values equal to 100% the direct current drain-to-source bias voltage $V_{ds\text{-}DC}$.

In addition to exhibiting the above-described drain-to-source capacitance response, the RF transistor amplifiers according to embodiments of the present invention may also have a drain-to-gate capacitance response that varies by less than a factor of two for a range of drain-to-source voltage values extending from two thirds the direct current drain-to-source bias voltage $V_{ds\text{-}DC}$ to the direct current drain-to-source bias voltage $V_{ds\text{-}DC}$ (e.g., $C_{ds}$ varies less than a factor of two for values of $V_{ds}$=32-48 volts, assuming a direct current drain-to-source bias voltage $V_{ds\text{-}DC}$=48 volts). Thus, pursuant to embodiments of the present invention RF transistor amplifiers are provided that have a relatively linear drain-to-gate capacitance response in the region of the drain voltage swing, which may result in improved performance.

Thus, for example, for the drain-to-gate capacitance response shown in TABLE 1, the drain-to-gate capacitance at $V_{ds}$=32 volts is 44.92×10$^{-15}$ F/mm, and the drain-to-gate capacitance at $V_{ds}$=48 volts is 26.26×10$^{-15}$ F/mm, which values differ by less than a factor of two.

The drain-to-source capacitance response may be normalized based on the output power of the RF transistor amplifier to provide a normalized drain-to-source capacitance response. Likewise, the drain-to-gate capacitance response may be normalized based on the output power of the RF transistor amplifier to provide a normalized drain-to-gate capacitance response. Herein, references to "normalized drain-to-source responses" and to "normalized drain-to-gate capacitance responses" refer to power normalized versions (i.e., in units of Farads per Watt) of the respective drain-to-source capacitance response and the drain-to-gate capacitance response (which are measured in units of Farads per millimeter). The normalized drain-to-source and drain-to-gate capacitance responses may be determined by dividing the drain-to-source and drain-to-gate capacitance responses, which are characterized as capacitance per unit length (e.g., F/mm) where the "length" corresponds to the gate width, by the output RF power per unit length (e.g., W/mm), which is also known as the output power density. Thus, the normalized drain-to-source and drain-to-gate capacitance responses are characterized in terms of capacitance per unit power. The RF power per unit length may be determined as follows:

RF Power (W/mm)=1/2*RF Voltage Magnitude (V)*RF Current Magnitude (A/mm)

The RF current magnitude is one-half the peak-to-peak RF current magnitude and the RF voltage magnitude is similarly one-half the peak-to-peak RF voltage magnitude. It should be noted, however, that the peak-to-peak RF voltage magnitude cannot exceed twice the drain-to-source bias voltage $V_{ds\text{-}DC}$ and hence in most cases the RF voltage magnitude will be equal to drain-to-source bias voltage $V_{ds\text{-}DC}$. Thus, in cases where the RF voltage magnitude is equal to drain-to-source bias voltage $V_{ds\text{-}DC}$, the RF power per unit length may be determined as follows:

RF Power (W/mm)=1/4*$V_{ds\text{-}DC}$ (V)*Peak-to-Peak RF Current (A/mm)

Figure 6A:
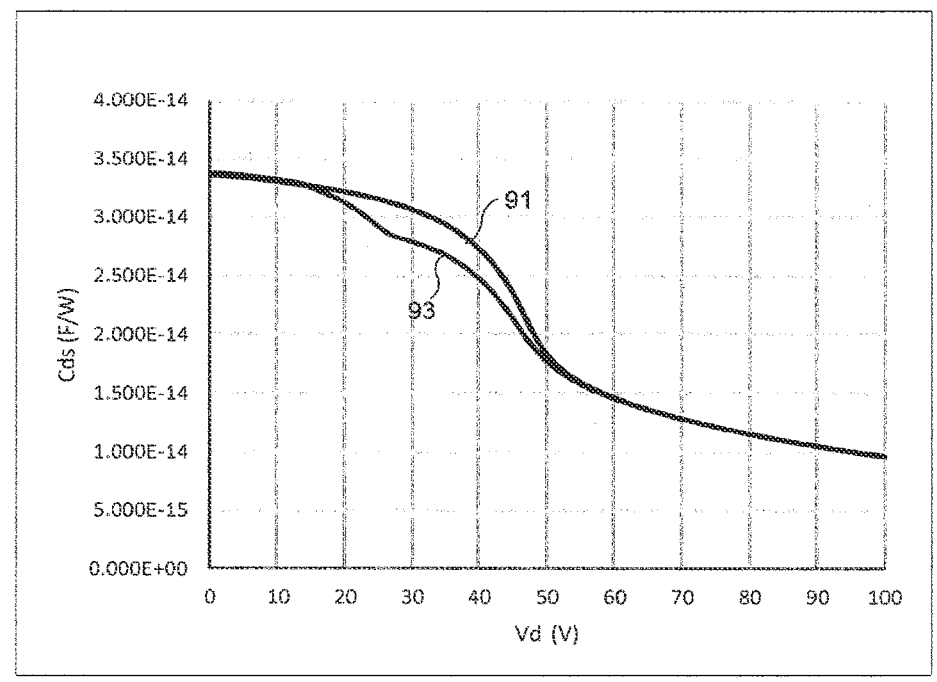
FIGS. 6A and 6B are, respectively, graphs of the normalized drain-to-source capacitance responses and the normalized drain-to-gate capacitance responses that were derived from the corresponding drain-to-source and drain-to-gate capacitance responses of FIGS. 5A and 5B.
Figure 6B:
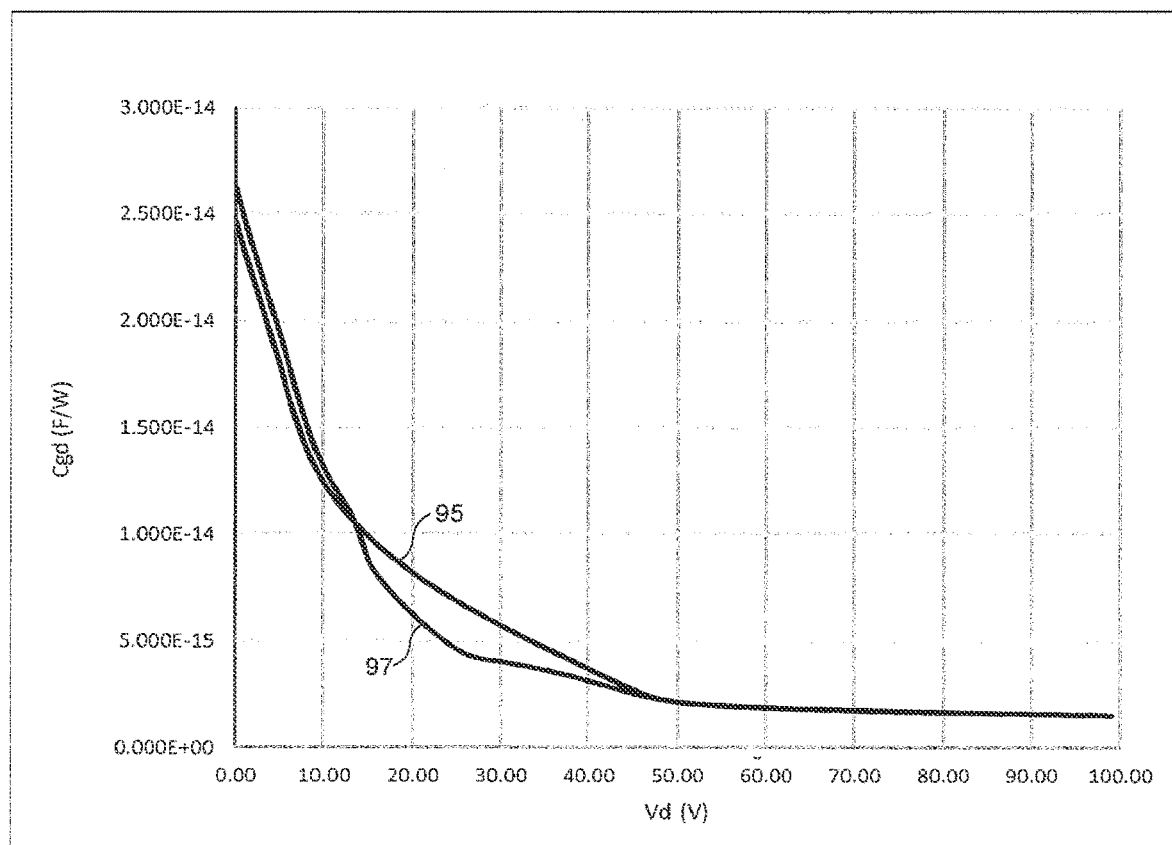

The normalized drain-to-source and drain-to-gate capacitance responses are computed without considering device losses such as the turn on resistance in order to allow for ready comparison. FIGS. 6A and 6B are graphs showing the normalized drain-to-source and drain-to-gate capacitance responses corresponding to the drain-to-source and drain-to-gate capacitance responses shown in FIGS. 5A and 5B, respectively. In FIG. 6A, curve 91 is the normalized drain-to-source capacitance response corresponding to curve 90 in FIG. 5A, and curve 93 is the normalized drain-to-source capacitance response corresponding to curve 92 in FIG. 5A. Likewise, in FIG. 6B, curve 95 is the normalized drain-to-gate capacitance response corresponding to curve 94 in FIG. 5B, and curve 97 is the normalized drain-to-gate capacitance response corresponding to curve 96 in FIG. 5B.

TABLE 2 below provides the data points corresponding to the normalized drain-to-source capacitance and drain-to-gate capacitance responses shown in FIGS. 6A and 6B when the RF transistor amplifier is operated at a direct current drain-to-source bias voltage $V_{ds\text{-}DC}$ of 48 volts. In TABLE 2, the values of Vas are in volts, and the values of $C_{ds}$ and $C_{dg}$ are in (Farads/Watt)×10$^{-14}$.

TABLE 2

| $V_{ds}$ | $C_{ds}$ | $C_{dg}$ |
|---|---|---|
| 1 | 3.374 | 2.472 |
| 2 | 3.370 | 2.332 |
| 3 | 3.365 | 2.199 |
| 4 | 3.360 | 2.067 |
| 5 | 3.354 | 1.933 |
| 6 | 3.348 | 1.796 |
| 7 | 3.341 | 1.648 |
| 8 | 3.334 | 1.517 |
| 9 | 3.326 | 1.403 |
| 10 | 3.319 | 1.312 |
| 11 | 3.311 | 1.234 |
| 12 | 3.302 | 1.163 |
| 13 | 3.293 | 1.097 |
| 14 | 3.275 | 0.994 |
| 15 | 3.247 | 0.873 |
| 16 | 3.225 | 0.807 |
| 17 | 3.202 | 0.754 |
| 18 | 3.177 | 0.707 |
| 19 | 3.150 | 0.665 |
| 20 | 3.120 | 0.625 |
| 21 | 3.086 | 0.588 |
| 22 | 3.049 | 0.553 |
| 23 | 3.009 | 0.520 |
| 24 | 2.964 | 0.489 |
| 25 | 2.916 | 0.461 |
| 26 | 2.873 | 0.438 |
| 27 | 2.840 | 0.423 |
| 28 | 2.819 | 0.414 |
| 29 | 2.806 | 0.409 |
| 30 | 2.788 | 0.403 |
| 31 | 2.769 | 0.396 |
| 32 | 2.749 | 0.389 |
| 33 | 2.727 | 0.381 |
| 34 | 2.703 | 0.373 |
| 35 | 2.675 | 0.365 |
| 36 | 2.643 | 0.355 |
| 37 | 2.608 | 0.346 |
| 38 | 2.570 | 0.336 |
| 39 | 2.527 | 0.325 |
| 40 | 2.478 | 0.314 |
| 41 | 2.424 | 0.303 |
| 42 | 2.364 | 0.292 |
| 43 | 2.296 | 0.280 |
| 44 | 2.220 | 0.268 |
| 45 | 2.138 | 0.256 |
| 46 | 2.053 | 0.245 |
| 47 | 1.969 | 0.235 |
| 48 | 1.893 | 0.227 |
| 49 | 1.827 | 0.221 |
| 50 | 1.771 | 0.215 |
| 51 | 1.722 | 0.211 |
| 52 | 1.680 | 0.207 |
| 53 | 1.642 | 0.204 |
| 54 | 1.609 | 0.201 |
| 55 | 1.578 | 0.199 |
| 56 | 1.550 | 0.197 |
| 57 | 1.524 | 0.195 |
| 58 | 1.499 | 0.193 |
| 59 | 1.477 | 0.191 |
| 60 | 1.455 | 0.189 |
| 61 | 1.434 | 0.188 |
| 62 | 1.414 | 0.186 |

TABLE 2-continued

| $V_{ds}$ | $C_{ds}$ | $C_{dg}$ |
|---|---|---|
| 63 | 1.396 | 0.185 |
| 64 | 1.378 | 0.184 |
| 65 | 1.361 | 0.182 |
| 66 | 1.344 | 0.181 |
| 67 | 1.328 | 0.180 |
| 68 | 1.312 | 0.179 |
| 69 | 1.297 | 0.178 |
| 70 | 1.283 | 0.177 |
| 71 | 1.269 | 0.176 |
| 72 | 1.255 | 0.175 |
| 73 | 1.242 | 0.174 |
| 74 | 1.229 | 0.173 |
| 75 | 1.216 | 0.172 |
| 76 | 1.204 | 0.171 |
| 77 | 1.192 | 0.170 |
| 78 | 1.180 | 0.169 |
| 79 | 1.168 | 0.168 |
| 80 | 1.157 | 0.167 |
| 81 | 1.146 | 0.167 |
| 82 | 1.135 | 0.166 |
| 83 | 1.124 | 0.165 |
| 84 | 1.113 | 0.164 |
| 85 | 1.103 | 0.163 |
| 86 | 1.093 | 0.163 |
| 87 | 1.083 | 0.162 |
| 88 | 1.073 | 0.161 |
| 89 | 1.063 | 0.161 |
| 90 | 1.054 | 0.160 |
| 91 | 1.045 | 0.159 |
| 92 | 1.035 | 0.158 |
| 93 | 1.026 | 0.158 |
| 94 | 1.017 | 0.157 |
| 95 | 1.009 | 0.156 |
| 96 | 0.999 | 0.156 |
| 97 | 0.991 | 0.155 |
| 98 | 0.983 | 0.154 |
| 99 | 0.975 | 0.154 |
| 100 | 0.967 | 0.153 |

Pursuant to embodiments of the present invention, gallium nitride based RF transistor amplifiers are provided that are configured to have a first normalized drain-to-gate capacitance $C_{ds1}$ at a first drain-to-source voltage $V_{ds1}$ that corresponds to the applied direct current drain-to-source bias voltage $V_{ds\text{-}DC}$, and to have a second normalized drain-to-gate capacitance $C_{dg2}$ at a second drain-to-source voltage Vase that corresponds to two thirds the applied direct current drain-to-source bias voltage $V_{ds\text{-}DC}$, where the second normalized drain-to-gate capacitance $C_{dg2}$ is less than twice the first normalized drain-to-gate capacitance $C_{dg1}$. For example, with respect to the RF transistor amplifier having the normalized drain-to-source and drain-to-gate capacitance responses shown in FIGS. 6A-6B and TABLE 2, the first normalized drain-to-gate capacitance $C_{dg1}$ at the first drain-to-source voltage that corresponds to the first direct current drain-to-source bias voltage $V_{ds\text{-}DC}$ (i.e., 48 volts) is 2.27 fF/W, and the second normalized drain-to-gate capacitance $C_{dg2}$ at a second drain-to-source voltage that corresponds to two thirds the first direct current drain-to-source bias voltage $V_{ds\text{-}DC}$ (i.e., 32 volts) is 3.89 fF/W. Here, $C_{dg1}$ (2.27 fF/W) is less than twice $C_{dg2}$ (3.89 fF/W).

In some embodiments, the normalized drain-to-gate capacitance response of the RF transistor amplifier may vary by less than a factor of four for all values of the drain-to-source voltage that are between one half the direct current drain-to-source bias voltage $V_{ds\text{-}DC}$ and twice the first direct current drain-to-source bias voltage. For example, with respect to the RF transistor amplifier having the normalized drain-to-source and normalized drain-to-gate capacitance responses shown in FIGS. 6A-6B and TABLE 2, the normalized drain-to-gate capacitance $C_{dg}$ at 24 volts (i.e., at one half the 48 volt direct current drain-to-source bias voltage $V_{ds\text{-}DC}$) is 4.89 fF/W. At 100 volts, the normalized drain-to-gate capacitance $C_{dg}$ is 1.53 fF/W, and hence the normalized drain-to-gate capacitance $C_{dg}$ varies by less than a factor of four over this voltage range.

In some embodiments, the RF transistor amplifier may be configured to have a normalized drain-to-source capacitance response that maintains at least about 80% symmetry or, in some cases, 90% symmetry for a range of drain-to-source voltage values about the direct current drain-to-source bias voltage $V_{ds\text{-}DC}$ that is equal to 50% the direct current drain-to-source bias voltage (i.e., a range of 24 volts about the 48 volt direct current drain-to-source bias voltage $V_{ds\text{-}DC}$, which is a range from 36-60 volts). For example, as discussed above, the RF transistor amplifier having the normalized drain-to-source and drain-to-gate capacitance responses shown in FIGS. 6A-6B and TABLE 2 is 92.6% symmetric for a voltage range of 24 volts about the 48 volt direct current drain-to-source bias voltage $V_{ds\text{-}DC}$ and is 89.8% symmetric for a voltage range of 48 volts. In other embodiments, the RF transistor amplifier may be configured to have a normalized drain-to-source capacitance response that maintains at least 70% symmetry for a range of drain-to-source voltage values about the direct current drain-to-source bias voltage $V_{ds\text{-}DC}$ that is equal to 100% the direct current drain-to-source bias voltage $V_{ds\text{-}DC}$.

Figure 7A:
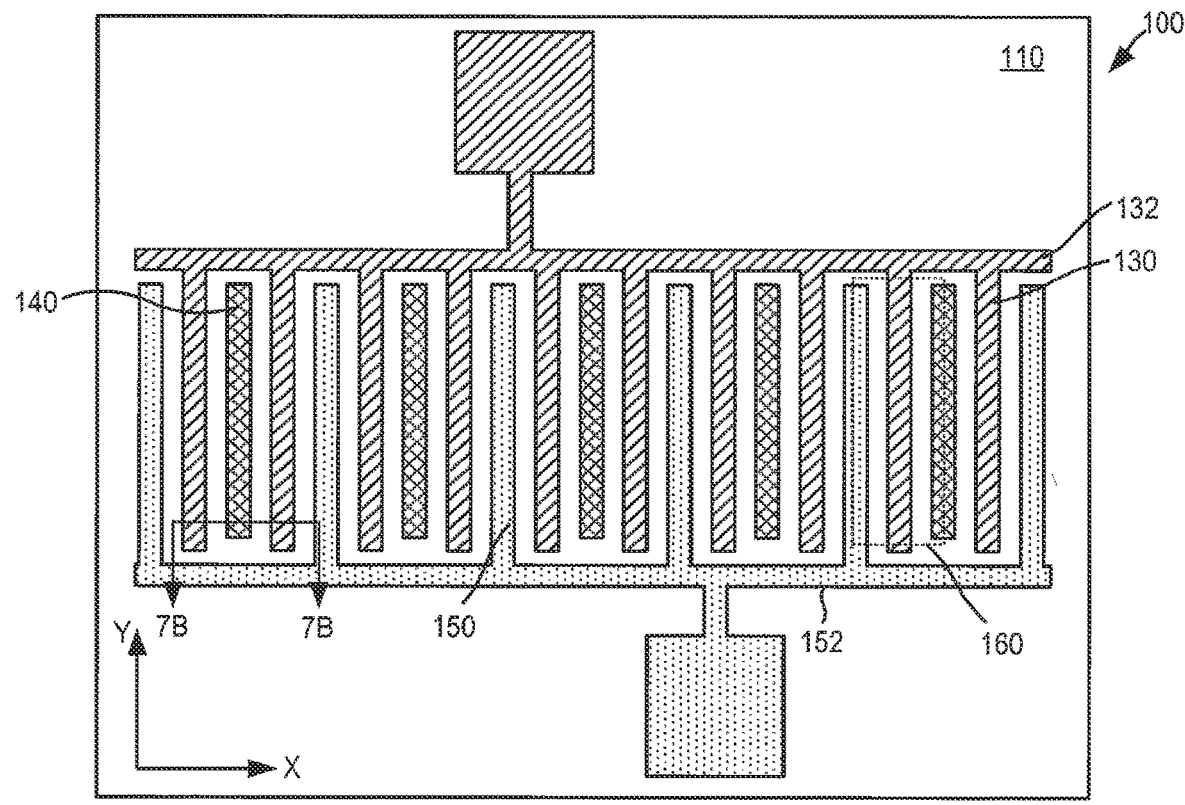
FIG. 7A is a schematic plan view of an RF transistor amplifier according to embodiments of the present invention.

FIG. 7A is a schematic plan view of an RF transistor amplifier 100 according to embodiments of the present invention. As shown in FIG. 7A, the RF transistor amplifier includes a plurality of gate fingers 130, a plurality of source fingers 140, and a plurality of drain fingers 150 that are formed on a semiconductor structure 110. The gate fingers 130 are spaced apart from each other along a first direction (e.g., the x-direction in FIG. 7A) and extend in a second direction (e.g., the y-direction in FIG. 7A). The gate fingers 130 are electrically connected to each other through a gate mandrel 132. The source fingers 140 are spaced apart from each other along the first direction and extend in the second direction. The source fingers 140 may be electrically connected to each other through vias or other structures (not visible in FIG. 7A) and may be electrically connected to a source contact on the bottom side of the semiconductor structure 110 (not visible in FIG. 7A). The drain fingers 150 are likewise spaced apart from each other along the first direction and extend in the second direction, and are electrically connected to each other through a drain mandrel 152. Each gate finger 130 extends in the y-direction between a pair of adjacent source and drain fingers 140, 150. The gate, source and drain fingers 130, 140, 150 may each comprise a conductive material, such as a metal or a metal alloy. It will be appreciated that FIG. 7A illustrates one simple example of the contact structures for RF transistor amplifier 100, and that in practice more complex, multi-layer contact structures may be used.

Each gate finger 130, along with an adjacent source finger 140 and drain finger 150, may define a unit cell transistor 160. A dashed box in FIG. 7A identifies a representative unit cell transistor 160. During operation, current flows between each source finger 140 and its associated drain finger 150 through a conduction path in the semiconductor structure 110. The amount of current may be modulated by a voltage signal applied to the gate fingers 130.

Figure 7B:
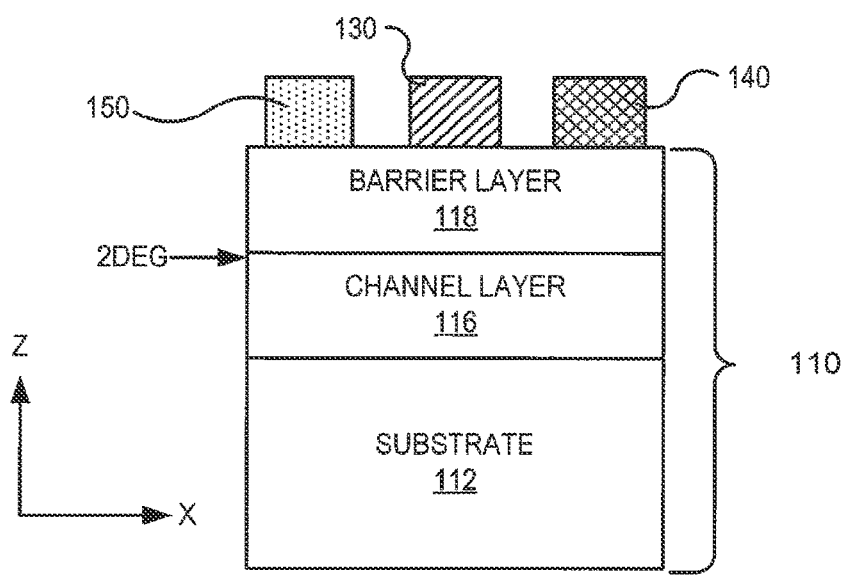
FIG. 7B is a cross-sectional view taken along line 7B-7B of FIG. 7A.

FIG. 7B is a cross-sectional view of the RF transistor amplifier 100 taken along line 7B-7B of FIG. 7A. As shown in FIG. 7B, the semiconductor structure 110 includes a substrate 112 and an epitaxial structure that is formed on the substrate 112. The substrate 112 may comprise a semiconductor substrate such as, for example, an aluminum nitride, aluminum gallium nitride, gallium nitride, silicon, silicon carbide, GaAs, LGO, ZnO, LAO, or InP substrate. Alternatively, the substrate 112 may be a non-semiconductor substrate such as, for example, a sapphire or diamond substrate that has a semiconductor epitaxial layer formed on an upper surface thereof. The epitaxial structure may include a channel layer 116 that is formed on the substrate 112, and a barrier layer 118 that is formed on the channel layer 116 opposite the substrate 112. The channel layer 116 and the barrier layer 118 may include Group III-nitride based materials, with the material of the barrier layer 118 having a higher bandgap than the material of the channel layer 116. For example, the channel layer 116 may comprise GaN, while the barrier layer 118 may comprise AlGaN. While the channel layer 116 and the barrier layer 118 are illustrated as single layer structures, it will be appreciated that either or both the channel layer 116 and/or the barrier layer 118 may be implemented as multi-layer structures. It will also be appreciated that additional layers such as, for example, buffer layers, strain-balancing layers, transition layers and the like may also be included as part of the epitaxial structure provided on the substrate 112.

Embodiments of the present inventive concepts have been described above with reference to the accompanying drawings, in which embodiments of the invention are shown. This inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the terms "comprises" "comprising," "includes" and/or "including" specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A radio frequency ("RF") transistor amplifier, comprising:
   a semiconductor structure that includes a gallium nitride based channel layer and a gallium nitride based barrier layer that has a higher bandgap than the gallium nitride based channel layer on the gallium nitride based channel layer;
   a source contact on the gallium nitride based barrier layer;
   a drain contact on the gallium nitride based barrier layer; and
   a gate contact on the gallium nitride based barrier layer between the source contact and the drain contact,
   wherein the RF transistor amplifier is configured to operate at a first direct current drain-to-source bias voltage,
   wherein the RF transistor amplifier is configured to have a first normalized drain-to-gate capacitance at the first direct current drain-to-source bias voltage, and to have a second normalized drain-to-gate capacitance at two-thirds the first direct current drain-to-source bias voltage, and
   wherein the second normalized drain-to-gate capacitance is less than twice the first normalized drain-to-gate capacitance.

2. The RF transistor amplifier of claim 1, wherein a normalized drain-to-gate capacitance response of the RF transistor amplifier varies by less than a factor of four for all values of the drain-to-source voltage that are between one half the first direct current drain-to-source bias voltage and twice the first direct current drain-to-source bias voltage.

3. The RF transistor amplifier of claim 1, wherein a normalized drain-to-gate capacitance response of the RF transistor amplifier varies by less than a factor of three for all values of the drain-to-source voltage that are between one half the first direct current drain-to-source bias voltage and twice the first direct current drain-to-source bias voltage.

4. A radio frequency ("RF") transistor amplifier, comprising:
   a semiconductor structure that includes a gallium nitride based channel layer and a gallium nitride based barrier layer that has a higher bandgap than the gallium nitride based channel layer on the gallium nitride based channel layer;
   a source contact on the gallium nitride based barrier layer;
   a drain contact on the gallium nitride based barrier layer; and
   a gate contact on the gallium nitride based barrier layer between the source contact and the drain contact,
   wherein the RF transistor amplifier is configured to operate at a first direct current drain-to-source bias voltage, wherein the RF transistor amplifier is configured to have a first normalized drain-to-gate capacitance at the first direct current drain-to-source bias voltage, and to have a second normalized drain-to-gate capacitance at two-thirds the first direct current drain-to-source bias voltage, and wherein the second normalized drain-to-gate capacitance is less than twice the first normalized drain-to-gate capacitance wherein the RF transistor amplifier is configured to have a normalized drain-to-source capacitance response that maintains at least 80% symmetry for a range of drain-to-source voltage values about the first direct current drain-to-source bias voltage that is equal to 50% of the first direct current drain-to-source bias voltage.

5. The RF transistor amplifier of claim 1, wherein the RF transistor amplifier is configured to have a normalized drain-to-source capacitance response that maintains at least 90% symmetry for a range of drain-to-source voltage values about the first direct current drain-to-source bias voltage that is equal to 50% of the first direct current drain-to-source bias voltage.

6. The RF transistor amplifier of claim 1, wherein the RF transistor amplifier is configured to have a normalized drain-to-source capacitance response that maintains at least 70% symmetry for a range of drain-to-source voltage values about the first direct current drain-to-source bias voltage that is equal to 100% of the first direct current drain-to-source bias voltage.

7. A radio frequency ("RF") transistor amplifier, comprising:
    a semiconductor structure that includes a gallium nitride based channel layer and a gallium nitride based barrier layer that has a higher bandgap than the gallium nitride based channel layer on the gallium nitride based channel layer;
    a source contact on the gallium nitride based barrier layer;
    a drain contact on the gallium nitride based barrier layer; and
    a gate contact on the gallium nitride based barrier layer between the source contact and the drain contact,
    wherein the RF transistor amplifier is configured to operate at a first direct current drain-to-source bias voltage,
    wherein the RF transistor amplifier is configured to have a first normalized drain-to-gate capacitance at the first direct current drain-to-source bias voltage, and to have a second normalized drain-to-gate capacitance at two-thirds the first direct current drain-to-source bias voltage, and
    wherein the second normalized drain-to-gate capacitance is less than twice the first normalized drain-to-gate capacitance
    wherein the RF transistor amplifier is configured to have a normalized drain-to-source capacitance response that maintains at least 80% symmetry for a range of drain-to-source voltage values about the first direct current drain-to-source bias voltage that is equal to 100% of the first direct current drain-to-source bias voltage.

8. The RF transistor amplifier of claim 7, wherein the RF transistor amplifier is configured so that the normalized drain-to-gate capacitance response varies by less than 100% for drain-to-source voltages in a range from the first direct current drain-to-source bias voltage to 20 volts below the first direct current drain-to-source bias voltage.

9. The RF transistor amplifier of claim 1, wherein the first direct current drain-to-source bias voltage is between 48 volts and 55 volts, and wherein values of the normalized drain-to-gate capacitance are less than $5 \times 10^{-15}$ farads per watt for all drain-to-source voltage values greater than 30 volts.

* * * * *

UNITED STATES PATENT AND TRADEMARK OFFICE
CERTIFICATE OF CORRECTION

PATENT NO. : 11,652,449 B2
APPLICATION NO. : 17/546273
DATED : May 16, 2023
INVENTOR(S) : Mu et al.

It is certified that error appears in the above-identified patent and that said Letters Patent is hereby corrected as shown below:

In the Specification

Column 5, Line 23: Please correct "drain-to gate" to read --drain-to-gate--

Column 6, Line 23: Please correct "Vas" to read --$V_{ds}$--

Column 6, Line 29: Please correct "Vas" to read --$V_{ds}$--

Column 6, Line 35: Please correct "Vas" to read --$V_{ds}$--

Column 8, Line 19: Please correct "Vas" to read --$V_{ds}$--

Column 8, Line 21-22: Please correct "Vas 62" to read --$V_{ds} \approx 62$--

Column 8, Line 26: Please correct "Vas" to read --$V_{ds}$--

Column 8, Line 63: Please correct "Vas" to read --$V_{ds}$--

Column 13, Line 9: Please correct "Vas" to read --$V_{ds}$--

Column 13, Line 11: Please correct "Vas" to read --$V_{ds}$--

Column 13, Line 11: Please correct "Case" to read --$C_{ds1}$--

Column 13, Line 13: Please correct "Vas" to read --$V_{ds}$--

Column 13, Line 19: Please correct "Vas" to read --$V_{ds}$--

Column 13-14, TABLE 1, Line 44: Please correct "56.43" to read --56.48--

Signed and Sealed this
Eighteenth Day of July, 2023

Katherine Kelly Vidal
*Director of the United States Patent and Trademark Office*

CERTIFICATE OF CORRECTION (continued)
U.S. Pat. No. 11,652,449 B2

Column 16, Line 11: Please correct "Vas" to read --$V_{ds}$--

Column 17, Line 44: Please correct "Vase" to read --$V_{ds2}$--